United States Patent
Tayebati et al.

(10) Patent No.: US 6,546,028 B1
(45) Date of Patent: Apr. 8, 2003

(54) OPTICAL FIBER WAVELENGTH REFERENCE DEVICE

(75) Inventors: Parviz Tayebati, Boston, MA (US); Reich Watterson, Lexington, MA (US); Kevin McCallion, Boston, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/636,806

(22) Filed: Aug. 10, 2000

Related U.S. Application Data

(60) Provisional application No. 60/148,016, filed on Aug. 10, 1999.

(51) Int. Cl.$^7$ ............................................. H01S 3/10
(52) U.S. Cl. ............................................. 372/20
(58) Field of Search ............................. 372/20, 32

(56) References Cited

U.S. PATENT DOCUMENTS 4,947,398 A * 8/1990 Yasuda et al. ............... 372/29
5,838,437 A * 11/1998 Miller et al. ................ 356/345

* cited by examiner

*Primary Examiner*—Paul Ip
*Assistant Examiner*—Jeffrey Zahn
(74) *Attorney, Agent, or Firm*—Pandiscio & Pandiscio

(57) ABSTRACT

An optical fiber wavelenght reference device for tuning a tunable Fabry-Perot filter and/or a tunable VCSEL to a desired frequency, where the device uses a fiber etalon to generate a pattern of reference frequencies against which the device is tuned.

2 Claims, 4 Drawing Sheets

US 6,546,028 B1

OPTICAL FIBER WAVELENGTH REFERENCE DEVICE

REFERENCE TO PENDING PRIOR PATENT APPLICATION

This patent application claims benefit of pending prior U.S. Provisional Patent Application Serial No. 60/148,016, filed Aug. 10, 1999 by Parviz Tayebati et al. for OPTICAL FIBER WAVELENGTH DEVICE, which patent application is hereby incorporated herein by reference.

FIELD OF THE INVENTION

This invention relates to photonic devices in general, and more particularly to tunable filters and tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 05, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent applications Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium 55 between bottom mirror 20 and bottom electrode 15. As a result, when gain medium 55 is appropriately stimulated, e.g., by optical pumping, lasing can be established within air cavity 45, between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune VCSEL 50.

Tunable Fabry-Perot filters and tunable VCSEL's of the type disclosed in the aforementioned U.S. patent applications Ser. Nos. 09/105,399 and 09/543,318 are highly advantageous since they can be quickly and easily tuned by simply changing the voltage applied across the top electrode and the bottom electrode.

However, it has been found that tunable Fabry-Perot filters and tunable VCSEL's of the type disclosed in U.S. patent applications Ser. Nos. 09/105,399 and 09/543,318 have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific frequency. This can present an issue in some applications, particularly telecommunications applications, where the devices may need to be tuned to precise, absolute wavelengths.

OBJECTS OF THE INVENTION

As a result, one object of the present invention is to provide a novel wavelength reference apparatus for calibrating a tunable Fabry-Perot filter and/or a tunable VSCEL, whereby the device may be tuned to a precise, absolute wavelength.

Another object of the present invention is to provide a novel wavelength-locking apparatus for tuning a tunable Fabry-Perot filter and/or a tunable VCSEL to a precise, absolute wavelength, and for thereafter keeping that device tuned to that wavelength.

Still another object of the present invention is to provide a novel method for calibrating a tunable Fabry-Perot filter and/or a tunable VSCEL, whereby the device may be tuned to a precise, absolute wavelength.

Yet another object of the present invention is to provide a novel method for wavelength-locking a tunable Fabry-Perot filter and/or a tunable VCSEL, whereby to tune the device to a precise, absolute wavelength, and for thereafter keeping that device tuned to that wavelength.

SUMMARY OF THE INVENTION

These and other objects are addressed by the present invention.

In one form of the invention, there is provided a wavelength reference apparatus for use in calibrating a tunable Fabry-Perot filter or a tunable VCSEL to a precise, absolute frequency on a target frequency grid, the wavelength reference apparatus comprising a fiber etalon wherein the fiber etalon is chosen so as to have a FSR much less than the target frequency grid, whereby when monotonic light is swept through the fiber etalon, the transmission peaks established by the fiber etalon will surround, and have much less spacing, than the target reference grid; and a detector for detecting the transmission peaks established by the fiber etalon.

In another form of the invention, there is provided a wavelength-locking apparatus for use in tuning a tunable Fabry-Perot filter or a tunable VCSEL to a precise, absolute frequency on a target frequency grid, the wavelength locking apparatus comprising a fiber etalon, wherein the fiber etalon is chosen so as to have a FSR much less than the target frequency grid, whereby when monotonic light is swept through the fiber etalon, the transmission peaks established by the fiber etalon will surround, and have much less spacing, than the target reference grid; a detector for detecting the transmission peaks established by the fiber etalon; and a controller for tuning the wavelength of the device by monitoring the transmission peaks of the fiber etalon.

In yet another form of the invention, there is provided a method for tuning a tunable Fabry-Perot filter or a tunable VCSEL, comprising the steps of: (1) sweeping light from the device through a fiber etalon in a monotonic manner so as to generate an inline comb of optical transmission peaks, the fiber etalon being chosen so that the spacing of its transmission peaks is much less than the spacing of the desired target frequencies; (2) identifying the frequency of one of the transmission peaks of the fiber etalon; and (3) monitoring the output of the fiber etalon as the device is tuned so as to tune the device to the desired frequency.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
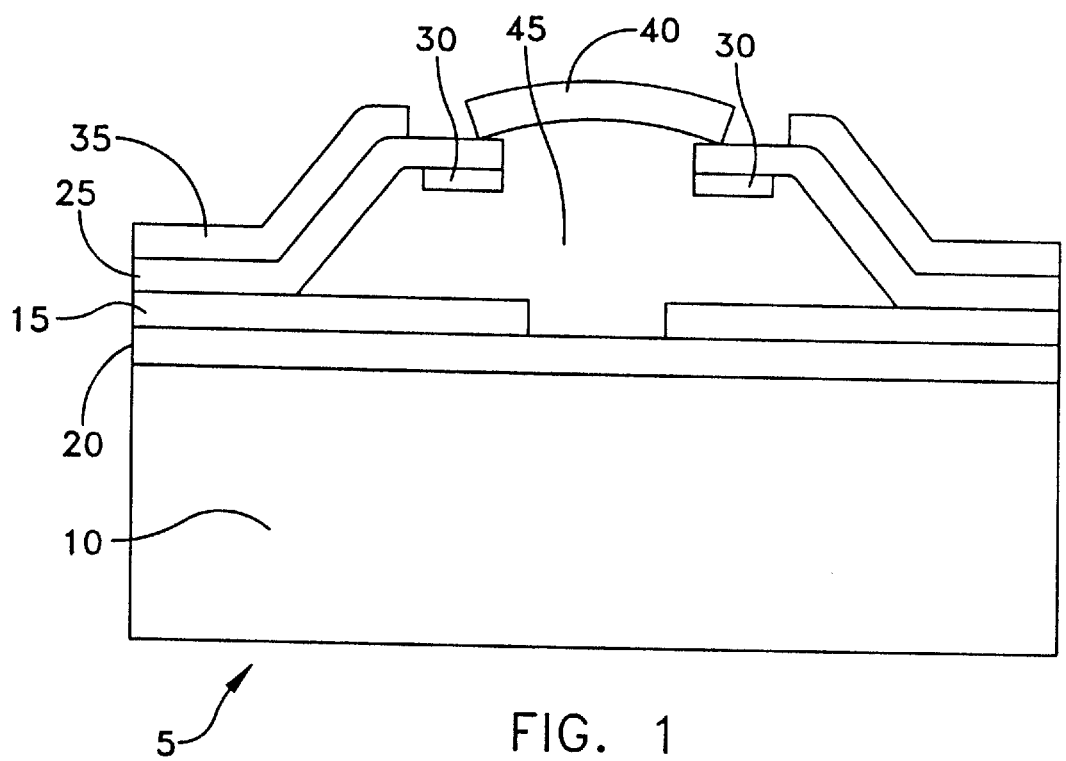
FIG. 1 is a schematic side view of a tunable Fabry-Perot filter.
Figure 2:
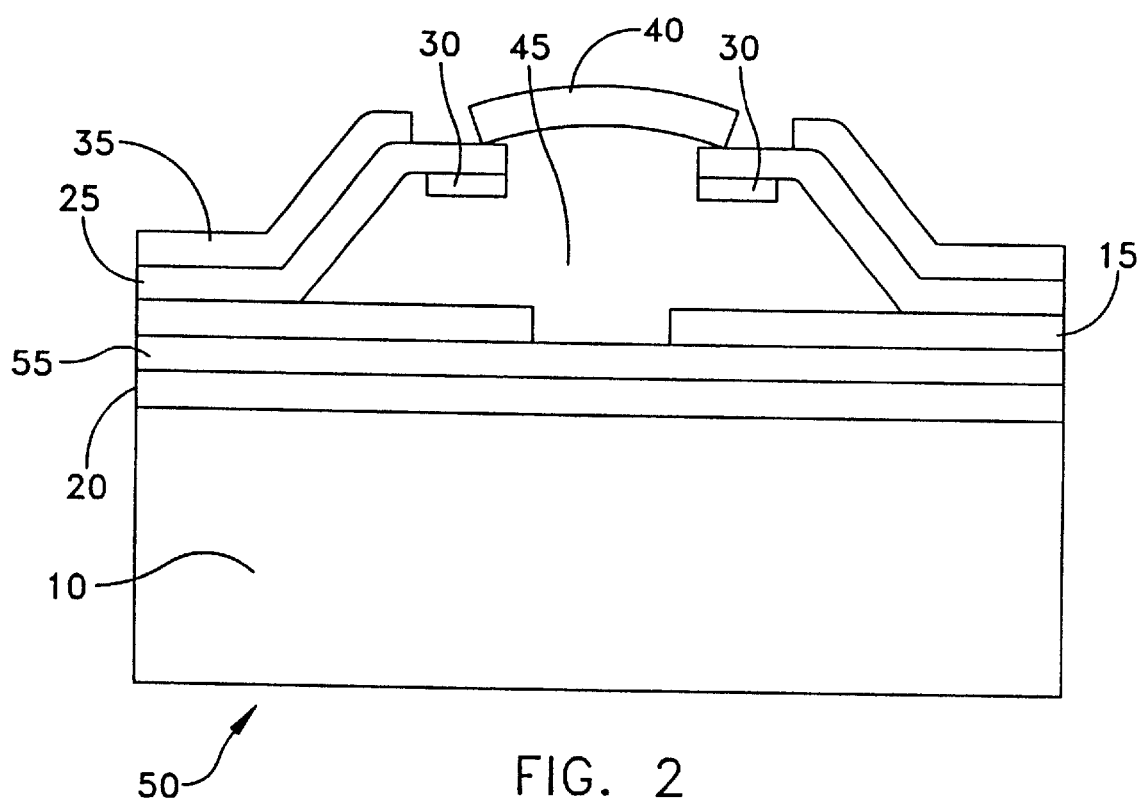
FIG. 2 is a schematic side view of a tunable VCSEL.
Figure 3:
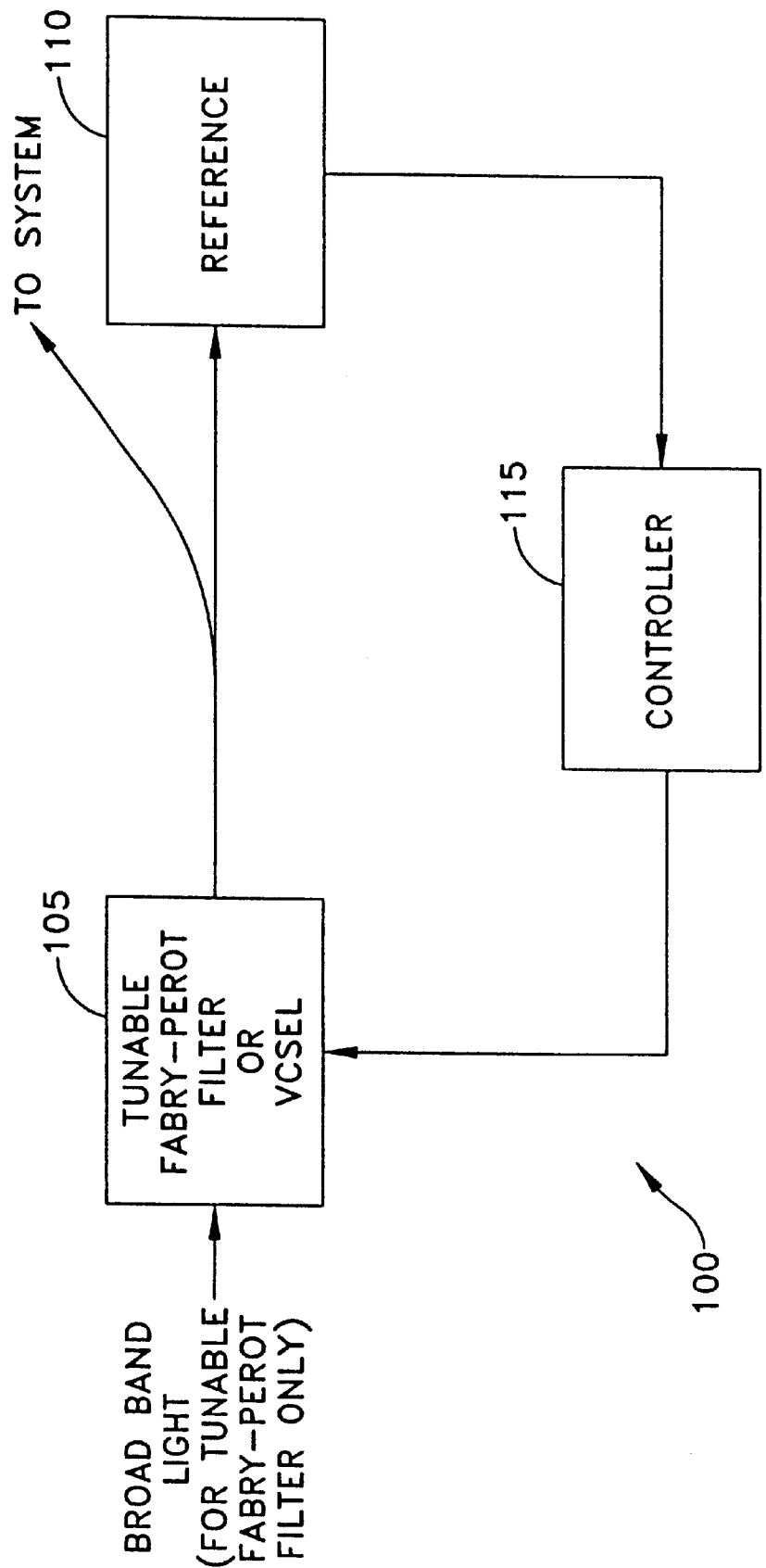
FIG. 3 is a schematic diagram of wavelength reference apparatus and wavelength-locking apparatus for tuning a tunable Fabry-Perot filter and/or a tunable VCSEL to a desired frequency, and for thereafter keeping that device tuned to that frequency.

Looking next at FIG. 3, there is shown a system 100 which comprises a wavelength reference apparatus for calibrating a tunable Fabry-Perot filter and/or a tunable VCSEL, whereby the device may be tuned to a precise, absolute wavelength. System 100 also provides a wavelength-locking apparatus to keep the tunable Fabry-Perot filter and/or tunable VCSEL tuned to a precise, absolute wavelength.

More particularly, system 100 generally comprises a tunable Fabry-Perot filter or tunable VCSEL 105, a wavelength reference apparatus 110, and a controller 115.

Tunable Fabry-Perot filter or tunable VCSEL 105 preferably comprises a tunable Fabry-Perot filter or tunable VCSEL of the type disclosed in U.S. patent applications Ser. Nos. 09/105,399 and 09/543,318. For convenience of description, tunable device 105 will hereinafter be described in the context of being a tunable VCSEL; however, it will be appreciated that the present invention is equally applicable to the situation where tunable device 105 comprises a tunable Fabry-Perot filter. Of course, using wavelength reference device 110 with a tunable Fabry-Perot filter would require that the tunable filter (and thus the etalon) be illuminated by an external broad band light source (see FIG. 3). This broad band light source could be either optically combined with, or switched with, a normal incoming light signal.

Figure 4:
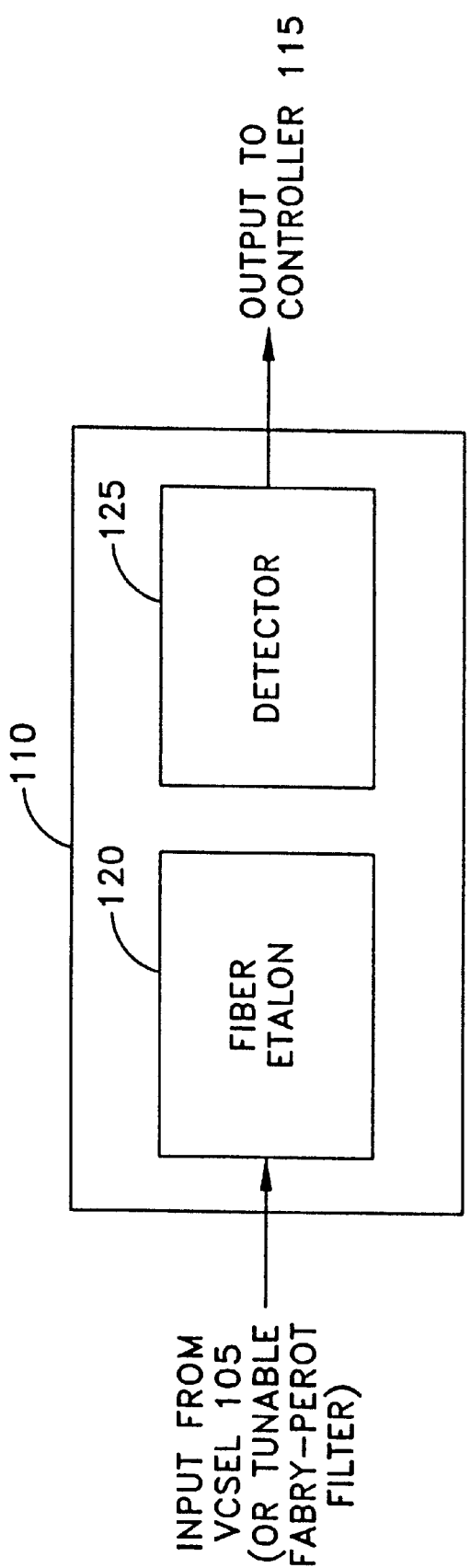
FIG. 4 is a schematic diagram of wavelength reference apparatus formed in accordance with the present invention.

Wavelength reference device 110 is adapted to provide a precise reference frequency at multiple wavelengths over the wavelength region of interest. These precise reference frequencies are located on precise, absolute wavelengths. In accordance with a preferred embodiment of the invention, and looking now at FIG. 4, wavelength reference device 110 comprises a fiber Fabry-Perot etalon 120 (sometimes hereinafter referred to simply as a "fiber etalon") and a detector 125, as will hereinafter be discussed in further detail.

Controller 115 comprises circuitry for reading the output of detector 125 and adjusting the voltage applied to VCSEL 105 so as to tune VCSEL 105 to the desired wavelength, and to thereafter keep it tuned to that wavelength, as will hereinafter be discussed in further detail.

Figure 5:
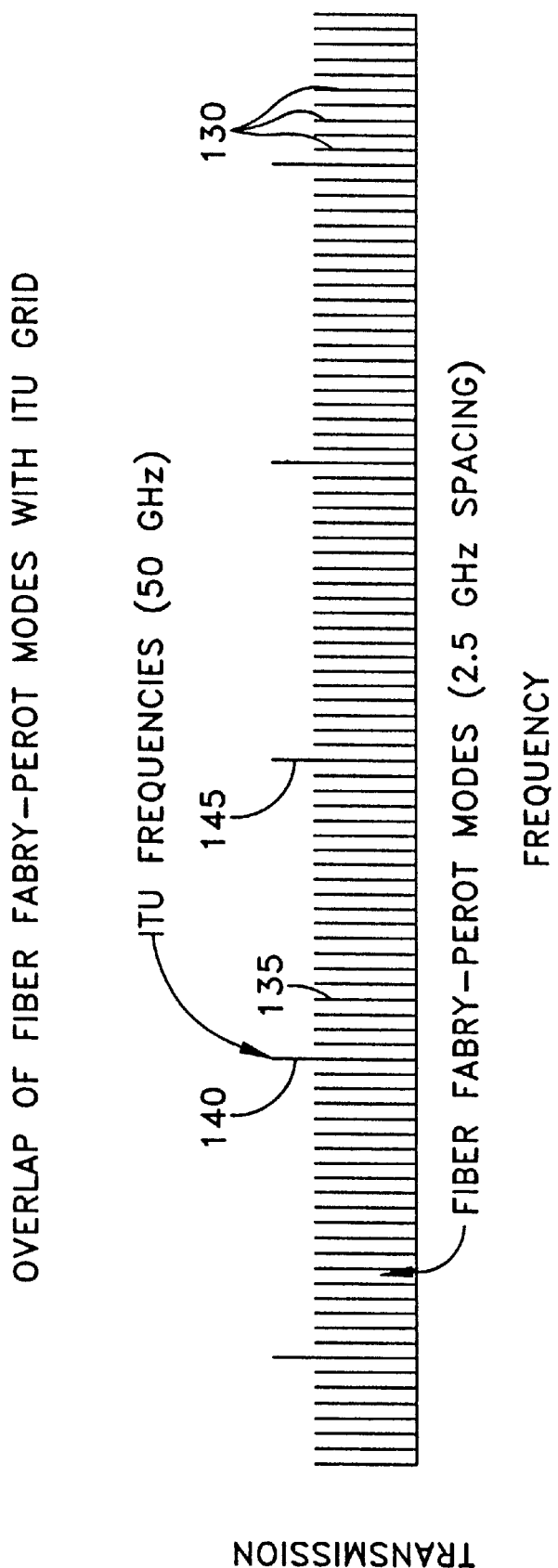
FIG. 5 shows the transmission peaks of a fiber etalon overlaid on the ITU frequency grid.

In essence, and looking now at FIG. 5, the fiber Fabry-Perot etalon 120 is used to generate an inline comb 130 of optical transmission peaks. This is done by sweeping the frequency of the light input to the fiber etalon in a monotonic manner, either by changing the frequency of the source (i.e., VCSEL 105) or by tuning a tunable optical filter inserted in the optical path. The optical transmission peaks of fiber etalon 120 occur at precise, absolute wavelengths according to the specific construction of fiber etalon 120. The fiber etalon is chosen (i.e., constructed) so that the spacing of the transmission peaks generated by the fiber Fabry-Perot etalon is much less than the spacing of the desired target frequencies (e.g., the ITU reference grid). A correspondence can then be established between the closely-spaced, fixed-frequency transmission peaks generated by the fiber etalon and the desired reference grid (e.g., the ITU frequencies). As a result, once an accurate single frequency is known in the fiber etalon's transmission peaks, the fiber etalon's finely-spaced transmission peaks can be used to tune VCSEL 105 to a desired target frequency.

More particularly, a peak detection circuit (in the form of controller 115) monitors the optical signal transmitted by the fiber Fabry-Perot etalon as the frequency of VCSEL 105 is swept in response to a voltage provided by the circuit. The detected peaks in the fiber etalon's transmitted optical intensity are counted and the peak number corresponding to each peak in the desired ITU frequency channel grid is recorded into a lookup table by the circuit. This calibrates the system for absolute frequency reference between the fiber etalon's finely-spaced, fixed-frequency transmission peaks and the ITU frequency grid. As a result, once an accurate single frequency is known in the fiber etalon's transmission peaks, the device can be tuned to the desired frequency by changing the tuning voltage in such a manner as to either increase or decrease the peak count number to that corresponding to the desired ITU frequency as determined above.

By way of example but not limitation, and looking now at FIG. 5, suppose that at a given voltage X, VCSEL 105 is generating light with a frequency Y such that fiber etalon 120 is generating the specific transmission peak 135. Suppose further that it is desired to tune VCSEL 105 so that it is generating light at the ITU frequency 140. In this case, the voltage being applied to VCSEL 105 is adjusted so that the peak detection circuit detects four (4) fiber etalon transmission peaks, whereupon VCSEL 105 will be generating light at the desired ITU frequency 140. Correspondingly, if fiber etalon 120 is at the transmission peak 135 and it is desired to tune VCSEL 105 to the ITU frequency 145, the voltage being applied to VCSEL 105 is adjusted so that the peak detection circuit counts sixteen (16) fiber etalon transmission peaks, whereupon VCSEL 105 will be generating light at the desired ITU frequency 145.

Furthermore, once VCSEL 105 has been tuned to the desired target frequency, the output of fiber etalon 120 can be monitored; if this output drifts off the desired transmission peak (i.e., indicating that VCSEL 105 has drifted off the desired target frequency), the system can adjust the voltage being applied to VCSEL 105 so as to bring the VCSEL back to the desired frequency by driving the output back to the desired transmission peak.

Temperature compensation is achieved by measuring the temperature by a temperature monitor and using that temperature value to change the peak number for locking to compensate for temperature changes.

The fiber Fabry-Perot etalon 120 preferably comprises a short length of single-mode optical fiber consisting, for example, of silica. The ends of the fiber are cleaved and polished perpendicular to the longitudinal axis of the fiber. Both ends of the fiber are coated with one or more layers of a dielectric film material of the sort well known in the art to control the resulting optical reflection properties. Light introduced into one end of the fiber will be transmitted at multiple frequencies (wavelengths). The transmission frequencies will be integer multiples of the free spectral range ("FSR") defined as FSR=c/2nL, where c is the speed of light, n is the refractive index of the fiber material, and L is the physical length of the fiber.

The FSR could be chosen to be equal to the ITU Wavelength Division Multiplexing grid (i.e., 200 GHz, 100 GHz, 50 GHz, 25 GHz). The corresponding fiber lengths (for silica fibers) are then 0.51 mm, 1.04 mm, 2.07 mm, and 4.14 mm. In the vicinity of each such multiple of the FSR, optical frequencies will be transmitted over a range of frequencies ~FSR/finesse, where finesse is determined by the reflectivity of the fiber ends.

For the purposes of this invention, detection of a maximum in transmitted power as the wavelength of the input light is varied (either by direct tuning, i.e., a tunable laser source, or by use of a tunable optical filter) will correspond to the identification of the wavelength of the transmitted light.

The elements of the system are configured so that the FSR of the fiber is much smaller than the ITU grid. This is achieved by using a fiber with a much longer length that the length required to generate the ITU frequencies, e.g., 20 times longer than the values quoted above for a 50 GHz ITU grid. See, for example, FIG. 5, where the fiber etalon's transmission peaks are shown superimposed on the ITU frequency grid. To tune VCSEL 105 to the desired frequency, the controlling electronics must then only count the peaks in the fiber etalon's transmission as the wavelength of the fiber etalon's input light is swept in a monotonic manner. A previous calibration of fiber etalon peak number versus wavelengths on the ITU standard wavelength grid provides a simple table look-up to convert the fiber etalon peak number into a known optical frequency (wavelength) for VCSEL 105. The accuracy with which such frequencies are known and controlled will thus be significantly less than the FSR of the fiber which is 5% of the ITU grid spacing. Elaborate dithering or highly accurate threshold circuits will not be required.

The effect of dispersion may be evaluated by comparing the change in FSR due to the difference in the index of refraction at 1520 $\mu$m and 1570 $\mu$m (1.444381, 1.44378). The relative change is $4.16\times10^{-4}$. The result of this dispersion is that, in counting from 1520 nm to 1570 nm with a 2.5 GHz FSR (2500 peaks), a one full period offset will be accumulated. A calibration and interpolation of the system response must account for this offset value.

An accurate single frequency among the fiber etalon's transmission peaks (i.e., non-ITU grid) is needed in order to start the counting in a known location. This accurate single frequency may be established through an initial calibration step. Alternatively, to the extent that the fiber etalon's transmission peaks occur in a unique pattern, it may be possible to sample several points along the pattern to identify a known frequency.

The effects of thermal changes are due to two processes: (1) the simple expansion of the fiber due to thermal expansion; and (2) the change in refractive index with temperature. These effects have the same sign and may be combined into a single net change of approximately $8.2\times10^{-4}$/C. Again, so long as an accurate single frequency reference is identified, then a 50 degree C. temperature swing will lead to a one FSR (2.5 GHz) accumulated error in counting from 1520 nm to 1570 nm. An independent temperature measurement will allow this offset to be removed. Due the high order at the start of the scan (76380), much larger shifts in the grid (0.62 orders/degree C.) will occur. Since new orders will enter the passband as the temperature changes, a single frequency reference will still be required.

In order to ensure good discrimination, the effective finesse should be at least 9 (11 dB peak to valley). Thus, each peak in the fiber etalon's transmission comb 130 will be 0.55 GHz wide. If the system is sampled at 0.125 GHz, then the worst case will be sampling 3 dB down, which is still 8 dB above the next nearest peak. Taking a VCSEL tuning characteristic of $\Delta\lambda=-\alpha V^2$, where $\alpha=0.17$ nm/$V^2$, a minimum tuning step (@ 40 V, 2.5 GHz FSR, 20 steps per FSR) of 75 $\mu$V can be estimated. This would then be within 1.25 GHz of the target frequency.

If desired, different values of free spectral ranges may be employed to generate the required grid.

Advantages of the Invention

Numerous advantages are achieved through the use of the present invention.

For one thing, an effective optical wavelength reference is provided in an extremely compact physical layout.

In addition, a simple electronics drive circuit is used, which uses peak counting to locate frequencies.

Furthermore, effective temperature compensation, via a simple temperature measurement and table lookup procedure, is also provided.

Modifications

It is to be understood that the present invention is by no means limited to the particular constructions and method steps disclosed above and/or shown in the drawings, but also comprises any modifications or equivalents within the scope of the claims.

What is claimed is:

1. A wavelength reference apparatus for use in calibrating a tunable Fabry-Perot filter or a tunable VCSEL to a precise, absolute frequency on a target frequency grid, the wavelength reference apparatus comprising:

a fiber etalon wherein the fiber etalon is chosen so as to have a FSR significantly less than the target frequency grid, whereby when monotonic light is swept through the fiber etalon, the transmission peaks established by the fiber etalon will surround, and have much less spacing, than the target frequency grid;

a detector for detecting the transmission peaks established by the fiber etalon;

identifier means for identifying an accurate single frequency among the fiber etalon's transmission peaks; and comparator means for determining a correspondence between transmission peaks generated by the fiber etalon and the target frequency grid so as to tune the tunable Fabry-Perot filter or the tunable VCSEL to the precise, absolute frequency grid once the accurate single frequency is known in the fiber etalon's transmission peaks.

2. A wavelength-locking apparatus for use in tuning a tunable Fabry-Perot filter or a tunable VCSEL to a precise, absolute frequency on a target frequency grid, the wavelength locking apparatus comprising:

a fiber etalon, wherein the fiber etalon is chosen so as to have a FSR significantly less than the target frequency grid, whereby when monotonic light is swept through the fiber etalon, the transmission peaks established by the fiber etalon will surround, and have much less spacing, than the target reference grid;

a detector for detecting the transmission peaks established by the fiber etalon;

identifier means for identifying an accurate single frequency among the fiber etalon's transmission peaks;

comparator means for determining a correspondence between transmission peaks generated by the fiber etalon and the target frequency grid so as to tune the tunable Fabry-Perot filter or said tunable VCSEL to the precise, absolute frequency on the target frequency grid once the accurate single frequency is known in the fiber etalon's transmission peaks; and a controller for tuning the wavelength of the device by monitoring the transmission peaks of the fiber etalon.

* * * * *